United States Patent [19]

Lee et al.

[11] Patent Number: 5,089,770
[45] Date of Patent: Feb. 18, 1992

[54] FREQUENCY MEASURING SYSTEM

[75] Inventors: Xiaoyang Lee, New York, N.Y.; Glenn M. Boles, Fords, N.J.

[73] Assignee: Lunayach Communications Consultants, Arlington, Va.

[21] Appl. No.: 482,405

[22] Filed: Feb. 20, 1990

[51] Int. Cl.$^5$ .............................................. G01R 23/10
[52] U.S. Cl. ............................... 324/78 D; 324/78 F; 324/79 D; 377/19; 455/36
[58] Field of Search ...................... 455/35, 36, 37, 38; 379/32, 33; 324/78 D, 79 D, 78 F; 377/19, 20

[56] References Cited

U.S. PATENT DOCUMENTS

| | | | |
|---|---|---|---|
| 4,146,836 | 3/1979 | Zimmer | 324/79 D |
| 4,707,856 | 11/1987 | Tanaka | 324/79 D |
| 4,733,169 | 3/1988 | Grindahl | 324/79 D |
| 4,807,146 | 2/1989 | Goodrich | 324/78 D |

*Primary Examiner*—Ernest F. Karlsen
*Assistant Examiner*—Jose M. Solis
*Attorney, Agent, or Firm*—Robert A. Green

[57] ABSTRACT

The disclosure is of a system for measuring the frequency of an audio signal by converting the signal to a rectangular wave, counting the number of oscillator pulses which can be generated during one cycle of said wave and decoding the number of pulses to obtain the frequency of the audio signal.

3 Claims, 3 Drawing Sheets

FREQUENCY MEASURING SYSTEM

BACKGROUND OF THE INVENTION

Cellular radio and telephone systems are in wide use and, in these systems, a mobile receiver operates through a plurality of cells, usually three, located in the area of the receiver. In the communication process, each cell or cell site generates a particular carrier signal or supervisory audio tone (SAT) having a specific frequency. These supervisory tones, from the three or more cell sites, are FM modulated with voice signals on each channel.

In the operation of these cellular systems, the cell sites are monitored to measure the frequency and power of the supervisory tones in order to insure that true carrier (SAT) frequencies are generated since proper operation of the receivers requires such exact signal frequencies.

Apparatus for monitoring the supervisory tones in a cellular system is available, however, such available apparatus is slow in operation and this is undesirable for use in a situation where a large number of frequency measurements are to be made.

SUMMARY OF THE INVENTION

The present invention provides a system for measuring or determining the frequency of a signal by filtering out the signal from all extraneous signals and then converting the filtered signal to a rectangular pulse. Clock pulses are provided and applied to circuitry for counting the number of clock pulses generated during one cycle of the signal to be measured. The number of clock pulses generated are a measure of the frequency of the signal and are processed to provide a readout of measured frequency.

DESCRIPTION OF THE INVENTION

Figure 1:
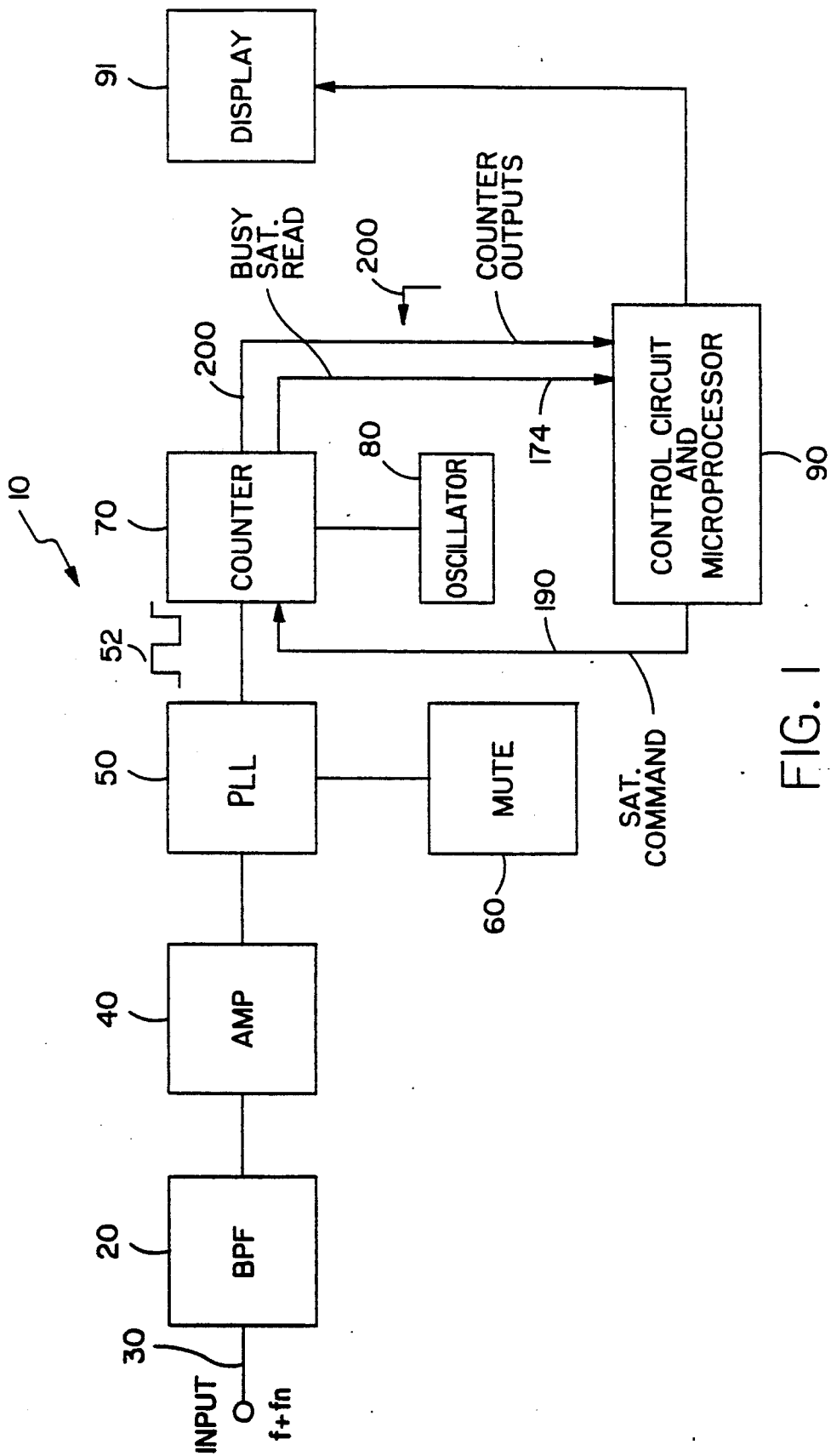
FIG. 1 is a schematic block diagram of the system of the invention.
Figure 3:
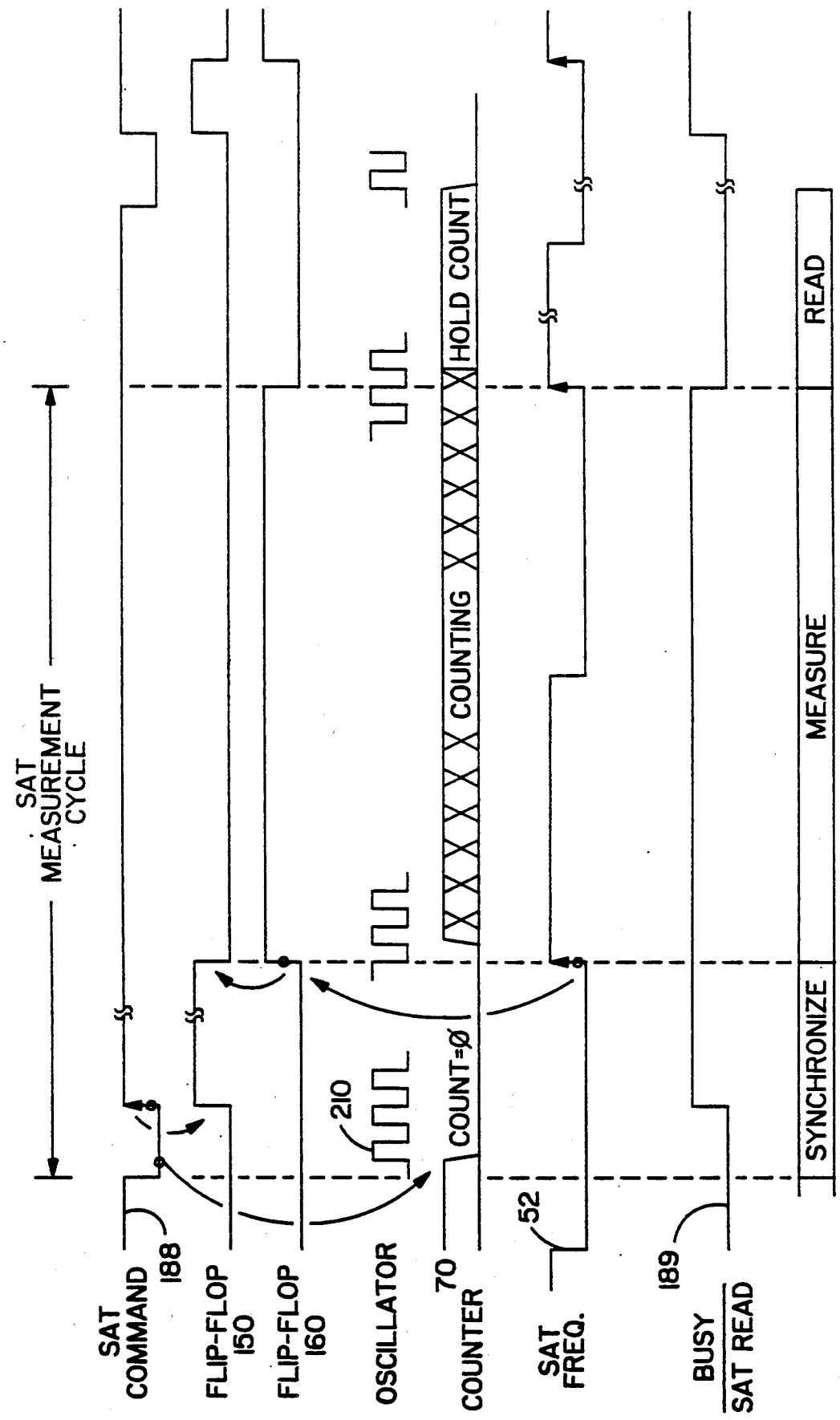
FIG. 3 shows some signal waveforms used in the system of the invention.

Referring to FIG. 1, a system 10 embodying the invention includes a band pass filter 20 having an input 30 to which is applied a signal including a supervisory audio tone (SAT signal) from a cellular site, and other possible signals including noise. The output of the band pass filter 20 is coupled to the input of an amplifier 40 and from there to the input of a phase lock loop circuit 50 which includes a mute circuit 60. The phase lock loop circuit 50 is used to convert the SAT signal applied to it to a rectangular pulse 52 (FIG. 3). This pulse is the SAT signal whose frequency is to be determined and it appears at the output of the circuit 50. The rectangular pulse 52 has a width or time duration which is representative of its frequency.

The mute circuit 60 is used to turn off the phase lock loop circuit 50 when no SAT signal is present or when no signal within a predetermined passband is present.

The output of the phase lock loop module 50, that is the pulses 52, are applied to a counter 70 to which an oscillator 80 is connected. The oscillator frequency is selected to be 4.9152 MHz in one embodiment of the invention. The circuitry operates the counter 70 for the duration of one cycle of the SAT signal and the number of pulses generated is counted and this count represents the frequency of the applied SAT signal. The pulses generated or the output of the counter 70 is applied to a microprocessor 90 for performing a decoding operation and to provide output signals which are sent to a display device 91 which provides a visual display of the exact SAT frequency or supervisory audio tone.

Figure 2:
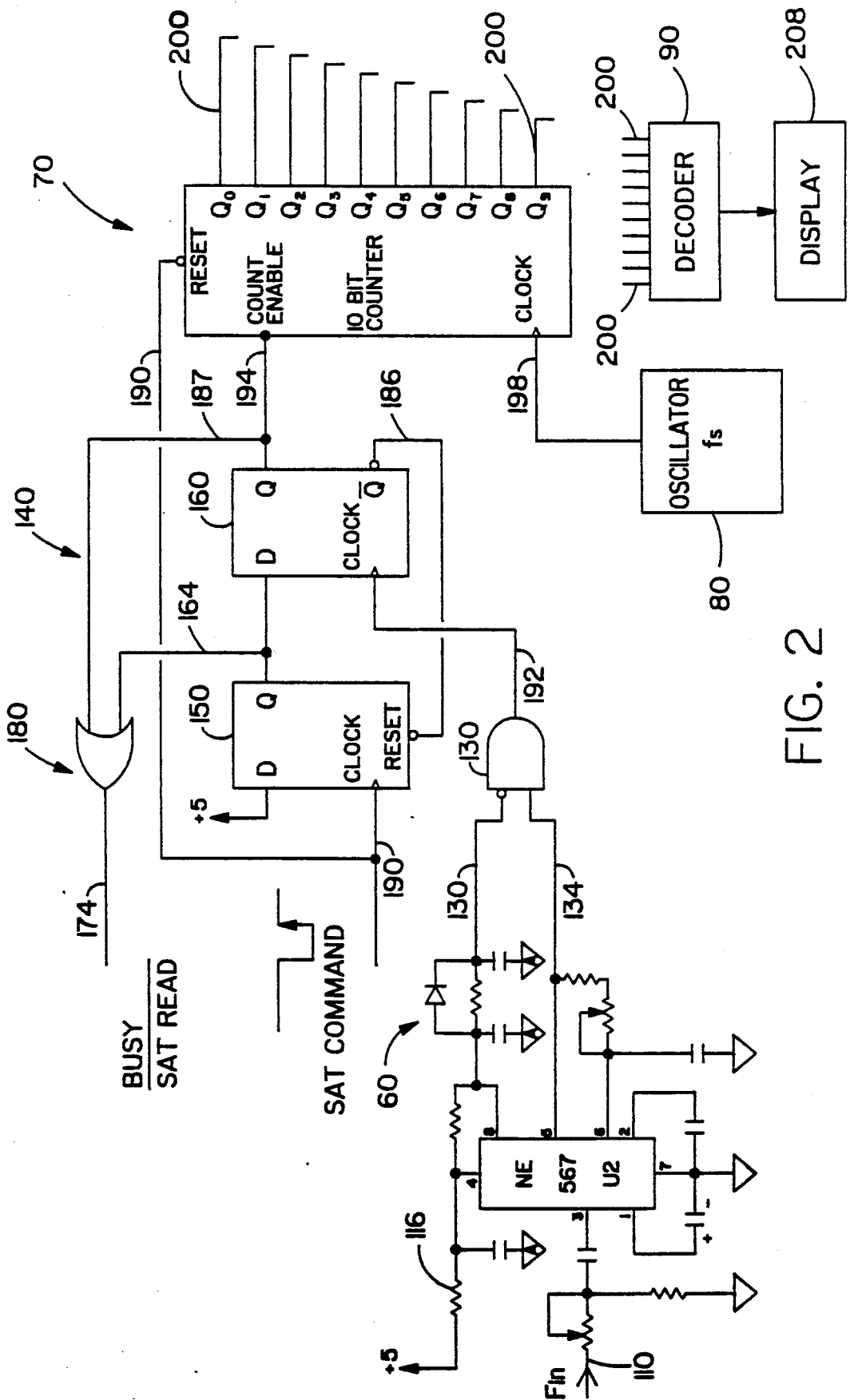
FIG. 2 is a more detailed schematic representation of the system of the invention.

A portion of the system of the invention is shown in greater detail in FIG. 2 in which the output of the amplifier 40 on lead 110 is coupled to the phase lock loop module 50. The phase lock loop may be of any suitable type such as the N5567 module made by Signetics Corp.

Operating potential is coupled through resistive path 116 to the phase lock loop module 50 and through the mute circuit 60 to one input of a gate 130, the second input of which comes from pin 5 of the phase lock loop module on lead 134.

The system 10, as shown in FIG. 2, also includes a control circuit 140 made up of two flip-flop modules 150 and 160. Module 150 includes a clock input pin to which is connected a source of negative pulses 188 (SAT Comm) which apply a logic zero to the clock pin. The flip-flop module 150 has its Q pin connected by lead 164 to the input D of flip-flop module 160. The lead 164 is also coupled by lead 166 to one input of a gate 180, the output of which is connected by lead 174 to a source of BUSY SAT READ signals 189. The second input to the gate 180 comes from the pin Q of flip-flop 160. Pin Q is connected by lead 186 to the reset pin of flip-flop 150. The pin Q of module 160 is connected by lead 194 to the count enable terminal of counter 70 which is a ten bit counter in one embodiment of the invention.

The clock pin of module 160 is connected by lead 192 to the output of gate 132.

In counter 70, the clock pin is connected by lead 198 to oscillator 80 and the reset pin is connected to the clock pin of flip-flop module 150 by lead 190. Counter 70 has ten output leads 200 which carry the counter output logic signals. These output leads from the counter modules are connected to a logic circuit or decoder 90 whose outputs represent one of the supervisory audio tones. The decoder output is also connected to a suitable display device 208 which provides a visual readout of the measured SAT frequency.

In operation of the system 10, referring to FIGS. 1 and 2, an audio signal from a cell site is applied to the input of the filter circuit 20. This input signal includes the SAT signal, possible voice signals and perhaps other signals. The filter 20 filters the input signal to derive the SAT signal. The signal is amplified by amplifier 40 and then it is applied to the phase lock loop 50. The phase lock loop module provides an output pulse which is the SAT pulse of unknown frequency.

The SAT pulse appears on lead 134 at the output of the phase lock loop module 50 and it is coupled through AND gate 130 to clock pin of flip-flop module 160.

At the same time oscillator 80 is constantly generating pulses which are applied to the clock pin of the counter 70.

When it is desired to analyze and determine the frequency of the SAT signal which appears at the output of the phase lock loop 50, a SAT command pulse (FIG. 3) from a computer or other source is applied to the clock input of flip flop module 150 and the reset of the 10 bit counter module 70. When the SAT COMMAND signal sets flip flop module 150, a signal appears on lead 164 to AND gate 180 and at the same time the latched SAT command signal 164 feeds the input of the second flip flop module 160 which is set and it generates a busy signal on lead 187 to gate 180. This sends a signal on lead 174 to the computer or other apparatus to advise that a measurement is to be made. The system now waits for the next positive going edge of the SAT signal from gate 130 to the clock of flip flop 160. This removes the first busy generated by the Q of module 150 and enables the 10 bit counter module 200 to start counting the higher frequency pulses from the oscillator module 80. The counter continues to count throughout one cycle of the SAT signal until its next rising edge at which time flip flop module 160 clears stopping the counter from counting any more oscillator pulses and removing the busy signal on lead 174. The low level now on lead 174 indicates that a measurement has been completed and is ready to be decoded and read. The count will remain valid in the counter until the next SAT command issued on lead 190.

The output of the counter 70 is decoded in the decoder 90 and the resulting frequency grading is displayed in the display device 208.

In one system of decoding, the frequency of the SAT signal is decoded as follows:

f(Sat measured) = f(Oscillator)/count
In our example: f(Oscillator) = 4.9152 MHZ

| f(Sat measured) FREQ. IN HZ | COUNT | | BINARY | | |
|---|---|---|---|---|---|
| | DEC | HEX | 98 | 7654 | 3210 |
| 5965.04 | 824 | 338 | 11 | 0011 | 1000 |
| *  5972.30 | 823 | 337 | 11 | 0011 | 0111 |
| 5979.56 | 822 | 336 | 11 | 0011 | 0110 |
| 5986.85 | 821 | 335 | 11 | 0011 | 0101 |
| 5994.15 | 820 | 334 | 11 | 0011 | 0100 |
| *  6001.47 | 819 | 333 | 11 | 0011 | 0011 |
| 6008.80 | 818 | 332 | 11 | 0011 | 0010 |
| 6016.16 | 817 | 331 | 11 | 0011 | 0001 |
| 6023.53 | 816 | 330 | 11 | 0011 | 0000 |
| *  6030.92 | 815 | 32F | 11 | 0010 | 1111 |
| 6038.33 | 814 | 32E | 11 | 0010 | 1110 |
| 6045.76 | 813 | 32D | 11 | 0010 | 1101 |

After the frequency of the SAT signal has been determined, an output SAT read signal appears at the output of gate 180 on lead 174 and this indicates that the analysis has been made by the system and that the It is noted that if the output signal on lead 134 out of the phase lock loop module is not within a desired frequency band, the phase lock loop is disabled and is inoperative.

As noted above, the speed of operation is a prime advantage of the invention and the frequency analysis can be performed by the system in $2 \times 10^{-7}$ seconds. Other known systems operate in a time which is considerably longer.

What is claimed is:

1. An electronic counter circuit comprising
an electronic counter including a reset terminal, a clock terminal, a control terminal at which disabling and enabling signals are applied and a plurality of output terminals at which digital signals appear representing counts entered in said counter,
an oscillator connected to said clock terminal,
a source of counter control signals of unknown frequency, said signals each having a positive going portion and a negative going portion,
said source of counter control signals coupled to said control terminal whereby one of said portions of said signal enables said counter and causes said oscillator to enter counts in said counter, the presence of said other portion of said signal at said control terminal disabling said counter, the number of counts entered in said counter by said oscillator representing the spacing between said portions of said signal and the frequency of said signal,
a decoder coupled to the output terminals of said counter for receiving said binary signals and identifying the frequency relationship of said control signals,
a first flip-flop having a reset terminal, a clock input terminal, a data input terminal and an output terminal,
a second flip flop having a reset terminal, a clock input terminal, a data input terminal and an output terminal,
said output terminal of said first flip flop being connected to said control terminal of said electronic counter,
said clock terminal of said first flip flop being connected to said source of counter control signals,
said output terminal of said second flip flop being connected to said data input terminal of said first flip flop,
a source of command pulses coupled to said clock terminal of said second flip flop and to said reset terminal of said counter, each of said command pulses causing said counter to be reset, each command pulse operating said first and second flip flops to provide a voltage level at the output of said first flip flop which holds said counter disabled,
one portion of each counter control signal coupled to said clock terminal of said first flip flop causing the voltage level on said output terminal of said first flop to change and to enable said counter whereby said oscillator can enter counts therein, the other portion of the signal coupled to said clock terminal of said first flip flop causing the voltage level on the output terminal of said first flip flop to change to a level which disables said counter and terminates the counting operation thereof.
2. The system defined in claim 1 and including
a gate having two inputs and an output, the output being coupled to a computer for advising the computer of the status of the counting operation,
the output terminal of said first flip flop and the output terminal of said second flip both being connected to the input of said gate, and
said source of command pulses including a gate having two inputs and an output, said output being connected to said clock terminal of said first flip flop and coupling command pulses thereto.
3. The system defined in claim 1 wherein said oscillator operates at high frequency of about 4 mHz.

* * * * *